(12) United States Patent
Pol

(10) Patent No.: US 9,288,923 B2
(45) Date of Patent: Mar. 15, 2016

(54) FIELD DEVICE

(71) Applicant: Ioan Mircea Pol, Lörrach (DE)

(72) Inventor: Ioan Mircea Pol, Lörrach (DE)

(73) Assignee: ENDRESS + HAUSER GMBH + CO. KG, Maulburg (DE)

( * ) Notice: Subject to any disclaimer, the term of this patent is extended or adjusted under 35 U.S.C. 154(b) by 0 days.

(21) Appl. No.: 14/354,745

(22) PCT Filed: Nov. 9, 2012

(86) PCT No.: PCT/EP2012/072232
§ 371 (c)(1),
(2) Date: Apr. 28, 2014

(87) PCT Pub. No.: WO2013/068522
PCT Pub. Date: May 16, 2013

(65) Prior Publication Data
US 2014/0284097 A1   Sep. 25, 2014

(30) Foreign Application Priority Data
Nov. 11, 2011   (DE) .......................... 10 2011 086 216

(51) Int. Cl.
| | | |
|---|---|---|
| H05K 5/02 | (2006.01) | |
| H02G 3/08 | (2006.01) | |
| H05K 7/14 | (2006.01) | |
| H05K 9/00 | (2006.01) | |

(52) U.S. Cl.
CPC ............ *H05K 5/0247* (2013.01); *H02G 3/083* (2013.01); *H05K 7/14* (2013.01); *H05K 9/0045* (2013.01)

(58) Field of Classification Search
USPC .................................... 174/529, 528
See application file for complete search history.

(56) References Cited

U.S. PATENT DOCUMENTS

| | | | |
|---|---|---|---|
| 4,579,405 A | | 4/1986 | Hirooka |
| 5,907,124 A | * | 5/1999 | Reiker ..................... E04B 9/006 174/51 |
| 2002/0002006 A1 | * | 1/2002 | Nakayama ............ F16B 37/002 439/625 |
| 2010/0101818 A1 | * | 4/2010 | Junjie ...................... H02G 3/14 174/66 |

FOREIGN PATENT DOCUMENTS

| | | |
|---|---|---|
| DE | 2748872 A1 | 5/1979 |
| DE | 29608312 U1 | 8/1996 |
| DE | 19940453 A1 | 3/2001 |
| DE | 19952643 C1 | 3/2001 |
| DE | 10060609 A1 | 9/2002 |

(Continued)

OTHER PUBLICATIONS

English Translation of the International Preliminary Report on Patentability, WIPO, Geneva, May 22, 2014.

(Continued)

*Primary Examiner* — Timothy Thompson
*Assistant Examiner* — Krystal Robinson
(74) *Attorney, Agent, or Firm* — Bacon & Thomas, PLLC

(57) ABSTRACT

A field device with a housing for accommodating an electronics unit. The housing is pot shaped and composed of a non-conductive material, wherein at least one line guide passageway with a screw thread is provided on the housing, wherein the line guide passageway is provided with a conductive coating in the region of the thread, and wherein the screw thread has at least one groove in at least one region extending in the axial direction of the line guide passageway.

6 Claims, 1 Drawing Sheet

(56) References Cited

FOREIGN PATENT DOCUMENTS

| | | | | |
|---|---|---|---|---|
| DE | 20314618 | U1 | 11/2003 | |
| DE | 19701371 | B4 | 2/2005 | |
| DE | 102007027104 | A1 * | 1/2008 | ............... H01R 4/64 |
| EP | 0129424 | B1 | 4/1987 | |
| WO | 0246744 | A2 | 6/2002 | |

OTHER PUBLICATIONS

Aug. 28, 2012 German Search Report, German Patent Office, Munich, Germany.

Mar. 28, 2013 International Search Report, EPO, The Netherlands.

* cited by examiner

FIELD DEVICE

TECHNICAL FIELD

The invention relates to a field device with a housing for accommodating an electronics unit, wherein the housing is pot shaped and composed of a non-conductive material, wherein at least one line guide passageway with a screw thread is provided on the housing and wherein the line guide passageway is provided with a conductive coating in the region of the thread. Especially, the invention relates to a field device for determining or monitoring a physical or chemical process variable in automation technology.

BACKGROUND DISCUSSION

In automation technology, especially in process and factory automation technology, field devices are often applied, which serve for registering and/or influencing process variables. Serving for registering process variables are sensors, such as, for example, fill level measuring devices, flow measuring devices, pressure- and temperature measuring devices, pH-redox potential measuring devices, conductivity measuring devices, etc., which register the corresponding process variables, fill level, flow, pressure, temperature, pH-value, and conductivity, respectively. Serving for influencing process variables are actuators, such as, for example, valves or pumps, via which the flow of a liquid in a pipeline section, respectively the fill level in a container, can be changed. Referred to as field devices are, in principle, all devices, which are applied near to the process and which deliver, or process, process relevant information. Understood to be field devices in connection with the invention are also remote I/Os, radio adapters, respectively, in general, devices, which are arranged at the field level and communicate with one another via a data bus. Often, one includes, in this connection, also network components. A large number of such field devices, or network components, are produced and sold by the firm, Endress+Hauser.

However, the invention is not limited to field devices in the above described sense. In general, the invention is applicable for all technical devices, in the case of which electromagnetic compatibility (EMC) plays a role. Electromagnetic compatibility designates the desired condition that devices do not interfere with one another due to electrical or electromagnetic effects. Expressed in other words: In general, the invention is applicable in the case of all devices, in the case of which components (housing, adapters, etc.) of a non-conductive material must be electrically contacted via a metallized screw thread.

Field devices usually have a housing for accommodating an electronics unit and a sensor unit, The housing is pot shaped and is often manufactured of a non-conductive material. Suitable materials include synthetic materials, e.g. plastics, or composite materials. Further provided on the housing is at least one line guide passageway having a screw thread. Electrical lines are led out of the housing through the line guide passageway. In order to prevent electrostatic charging of the housing, at least the inner surfaces of the housing and the line guide passageway with screw thread are provided with a conductive coating.

In the case of the metallizing, respectively in the case of the coating with a conductive material, the particles do not deposit uniformly and continuously in the threads of a passageway. As a result of this, there arises along the thread of the passageway a helically shaped path, which significantly lengthens the distance, which the electrical charges travel in the region of the passageway. The lengthening of the distance leads automatically to an increase of the resistance between two measurement points, of which one measuring point is located within the housing and the other measuring point is located outside of the housing. This is naturally disadvantageous for draining away undesired charges.

For a long time, this problem has been solved by grounding the field device via a supplemental part, e.g. a bridging strut or a metal contact strip. The corresponding supplemental parts bring the following disadvantages: logistical effort, caring for the material, assembly effort, sealing problems, additional costs- and time consumed, poor appearance, risk that contaminations collect, risk of injury, etc.

SUMMARY OF THE INVENTION

An object of the invention is to reduce the effort and complications involved with grounding a field device.

The invention is solved by features including that the screw thread has at least one groove in at least one region extending in the axial direction of the line guide passageway. As already earlier mentioned, the housing is manufactured of a non-conductive material, especially a synthetic material, e.g. a plastic, or a composite material.

An advantageous further development of the field device of the invention provides that the groove, respectively the grooves, has/have at least the same depth as the depth of the thread. In this way, the influence of an increased resistance resulting from a lengthened electrical current path through the thread can be eliminated. In a preferred embodiment, from redundancy considerations, at least two grooves are provided on each line guide passageway of the field device: If there is in the region of one groove a disturbance of the electrical current path, then the draining of the undesired charges occurs through the smaller resistance of the other groove.

The housing with grooves in the region of a passageway can be manufactured, for example, via an injection molding method. Optionally, form converting methods or an alternative manufacturing method can be used. Thus, in an additional embodiment, the groove, respectively grooves, is/are subsequently machined into the region of the thread.

In summary, the field device of the invention includes advantages as follows:
- no additional components, such as bridging parts, are required for grounding;
- logistical effort is minimized;
- care of material is minimized;
- assembly effort is minimized;
- sealing problems are absent;
- time consumed for assembly is reduced;
- costs are reduced;
- appearance is improved;
- risk of dirt collection is absent;
- risk of injury, such as in the case of use of a bridging strut, is absent.

BRIEF DESCRIPTION OF THE DRAWINGS

The invention will now be explained in greater detail based on the appended drawing, the figures of which show as follows.

DETAILED DISCUSSION IN CONJUNCTION WITH THE DRAWING

Figure 1:
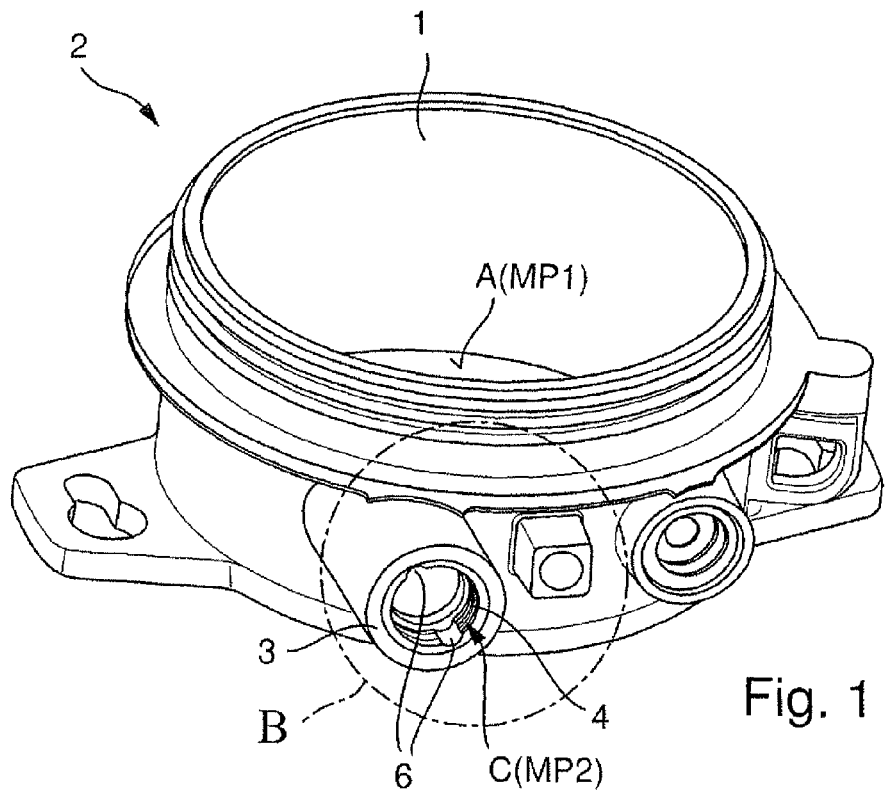
FIG. 1 is a perspective view of the housing of a field device, in the case of which the invention is used.

FIG. 1 shows a perspective view of the housing 2 of a field device, in the case of which the invention is utilized. The terminology, field device, has already been explained above.

Housing 2 of the field device (not separately illustrated in FIG. 1) serves for accommodating an electronics unit (not shown). A sensor unit for determining and/or monitoring a process variable in automation technology is either secured directly on the housing 2 (compact sensor), or sensor unit and electronics unit are embodied separately and connected via a cable. Housing 2 is embodied essentially with pot shape and is manufactured of a non-conductive material. Especially, housing 2 is composed of a synthetic material, e.g. a plastic, or a composite material.

With reference to FIG. 1, a line guide passageway 3 is provided on the housing 2. Line guide passageway 3 has an internal thread 4. Of course, the following statements hold also in the case of an external thread. In the illustrated case, the inner surface of the housing 2 and the inner surface of the line guide passageway 3 in the region of the thread 4 are provided with a conductive coating 5. In such case, there arises the problem that the metal-particles in the case of the metallizing, respectively in the case of the coating with a conductive material, do not deposit uniformly and continuously in the region of the thread 4. As a result thereof, there arises in the thread 4 of the line guide passageway 3 a helically formed path, whereby the distance, which the electrical charges must travel in the region of the line guide passageway 3 is, in given cases, significantly lengthened. The lengthening of the distance, which the charges must travel, leads automatically to an increasing of the resistance between measurement points A(MP1), C(MP2) on the housing 2 shown, by way of example, in FIG. 1. This increasing of the resistance is naturally disadvantageous for draining undesired charges away.

Figure 2:
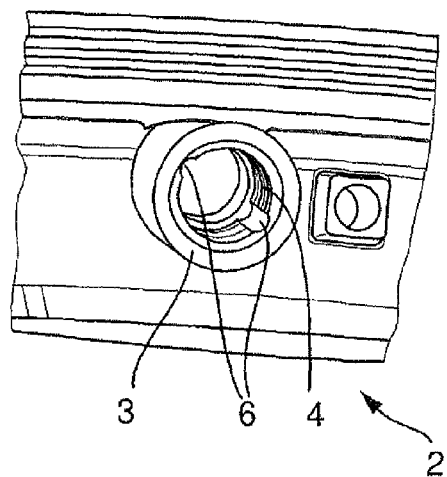
FIG. 2 is an enlarged view of section B of FIG. 1.

According to the invention, the screw thread 4 of the line guide passageway 3 includes, for the purpose of improving and simplifying the grounding of the field device, a groove 6 in at least one region extending in the axial direction of the line guide passageway 3. Preferably, the groove 6 is arranged parallel to the longitudinal axis of the line guide passageway 3. In the illustrated case, the screw thread 4, such as indicated in the enlarged section B of FIG. 1 shown in FIG. 2, includes, in fact, two grooves 6. These two grooves 6 provide a redundancy such that, in case the path via one groove 6 fails, then the charges can still take the path via the redundant, other groove 6. The groove 6, respectively the grooves 6, has, respectively have, at least the same depth as the depth of the thread 4. If this condition is fulfilled, then the effect of the thread, by which the resistance in the region of the thread is increased, is completely eliminated. The invention, thus, significantly improves the EMC performance of a field device.

The invention claimed is:

1. A field device comprising a housing for accommodating an electronics unit, wherein:
    said housing is pot shaped and composed of a non-conductive material, at least one line guide passageway with a screw thread is provided on said housing;
    said line guide passageway is provided with a conductive coating in the region of said thread;
    said screw thread has at least one groove in at least one region extending in an axial direction of said line guide passageway; and
    said at least one groove having at least the same depth as the depth of said thread.

2. The field device as claimed in claim 1, wherein:
    said housing is manufactured of a synthetic material or a composite material.

3. The field device as claimed in claim 1, wherein:
    at least two grooves are provided on said line guide passageway.

4. The field device as claimed in claim 1, wherein:
    said housing is manufactured via an injection molding method, a form converting method or an alternative manufacturing method.

5. The field device as claimed in claim 1, wherein:
    said groove, respectively grooves, is/are subsequently machined into said screw thread.

6. The field device as claimed in claim 1, wherein the at least one groove is configured in a way to ground the field device.

* * * * *